(12) United States Patent
Izumitani et al.

(10) Patent No.: US 6,333,259 B1
(45) Date of Patent: Dec. 25, 2001

(54) SEMICONDUCTOR DEVICE AND APPARATUS AND METHOD FOR MANUFACTURING THE SAME

(75) Inventors: Junko Izumitani; Kazuyoshi Maekawa, both of Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/263,771

(22) Filed: Mar. 5, 1999

(30) Foreign Application Priority Data

Aug. 25, 1998 (JP) .................................................. 10-239190

(51) Int. Cl.$^7$ .............................................. H01L 21/4763
(52) U.S. Cl. ..................... 438/642; 438/592; 438/655; 438/656; 438/908; 438/952; 438/632; 438/652
(58) Field of Search ..................................... 438/592, 642, 438/655, 656, 908, 952, 632, 652

(56) References Cited

U.S. PATENT DOCUMENTS

| | | |
|---|---|---|
| 4,325,776 | 4/1982 | Menzel . |
| 4,970,176 | 11/1990 | Tracy et al. . |
| 5,318,923 | 6/1994 | Park . |
| 5,723,367 * | 3/1998 | Wada et al. ............................ 437/248 |
| 5,770,515 * | 6/1998 | Meng et al. ........................... 438/592 |
| 5,989,623 * | 11/1999 | Chen et al. ............................. 427/97 |
| 6,090,701 * | 7/2000 | Hasunuma et al. ................... 438/632 |

FOREIGN PATENT DOCUMENTS

| | | |
|---|---|---|
| 54-8129 | 1/1979 | (JP) . |
| 59-220915 | 12/1984 | (JP) . |
| 3-156920 | 7/1991 | (JP) . |
| 3-166722 | 7/1991 | (JP) . |
| 5-211133 | 8/1993 | (JP) . |
| 7-74177 | 3/1995 | (JP) . |

* cited by examiner

Primary Examiner—Matthew Smith
Assistant Examiner—V. Yevsikov
(74) Attorney, Agent, or Firm—McDermott, Will & Emery

(57) ABSTRACT

Disclosed is an apparatus for manufacturing a semiconductor device including a metal film which is formed on a semiconductor substrate in a film formation region containing the interior of a hole formed in the semiconductor substrate. The apparatus includes a degassing chamber, a film forming chamber, and a cooing chamber. The degassing chamber 34 is provided for carrying out a degassing process by heating the semiconductor substrate to a degassing temperature. The film forming chamber 40 is provided for forming a metal film on the film formation region in a state in which the semiconductor substrate is heated to a film formation temperature. The cooling chamber 38 is provided for cooling, after completion of the degassing process and before beginning of the formation of the metal film, the semiconductor substrate to a cold temperature being lower than the film formation temperature and in a range of −50° C. to 150° C.

5 Claims, 13 Drawing Sheets

SEMICONDUCTOR DEVICE AND APPARATUS AND METHOD FOR MANUFACTURING THE SAME

BACKGROUND OF THE INVENTION

1. Field of the Invention

The present invention generally relates to a semiconductor device, and an apparatus and a method for manufacturing the same. More particularly, the present invention relates to a semiconductor device including a metal film formed on a semiconductor substrate in a specific region, and an apparatus and a method suitable for manufacturing the semiconductor device.

2. Description of the Background Art

FIG. 26 shows a flow chart of a sequence of processes performed in a former manufacturing method of a semiconductor device. The sequence of processes shown in FIG. 26 are performed for forming a metal film on a semiconductor substrate in a specific region including the interior of a contact hole, via hole, trench or the like (which is hereinafter referred to generally as "hole") provided in the semiconductor substrate. As shown in FIG. 26, the process of forming a metal film begins with a step 10.

At the step 10 is performed a degassing process in which a gas contained in a semiconductor substrate is released by heating the substrate to a specific degassing temperature in a vacuum atmosphere. The purpose of the degassing process is to prevent the formation of a metal film from being obstructed by the gas contained in the semiconductor substrate. Following the degassing process, a treatment at a step 12 is performed as needed.

At the step 12 is performed a sputter etching for enlarging a hole top, that is, a portion near an opening edge of a hole. The increased diameter of the hole top by sputter etching at the step 12 allows easy formation of a metal film in the hole. It should be noted that the sputter etching at the step 12 may be omitted.

The process goes on to a step 14 at which is performed a treatment of forming a metal film on the surface of the semiconductor substrate in a state that the substrate is heated to a specific film formation temperature.

At the final step 16 is performed a process of cooling the semiconductor substrate remaining heated at the film formation temperature to room temperature. In this way, one metal film is formed on the semiconductor substrate. Hereinafter, the above sequence of processes are referred to as "a first prior art process".

FIG. 27 shows a flow chart of a sequence of processes, different from those shown in FIG. 26, carried out in another former process for manufacturing a semiconductor device. The sequence of processes shown in FIG. 27 are performed for forming a stacked metal film composed of a plurality of metal films different in material on the surface of a semiconductor substrate. It should be noted that steps in FIG. 27 for performing the same processes as those at the steps in FIG. 26 are denoted by the same reference numerals, and the explanation thereof is omitted.

As shown in FIG. 27, in the process of forming a stacked metal film, after completion of a treatment of forming a first metal film (treatment at the same step 14 as that shown in FIG. 26), a treatment of forming a second metal film (treatment at a step 18) is performed.

At the step 18 is performed the treatment of forming the second metal film on the first metal film already formed on the surface of the semiconductor substrate, in a state in which the substrate is heated to a specific film formation temperature. Following this treatment, a treatment of cooling the semiconductor substrate to room temperature (at the same step 16 as that shown in FIG. 26) is executed, to thus complete the process of forming the stacked metal film. Hereinafter, the above sequence of processes are referred to as "a second prior art process".

In the first or second prior art process, during degassing or sputter etching is heated the semiconductor substrate to a temperature higher than the temperature required for formation of the metal film. Also in the second prior art process, the treatment of forming the first metal film may cause the semiconductor substrate to be heated to a temperature higher than the temperature required for formation of the second metal film. In particular, if the first or second prior art process is carried out using a fabrication apparatus capable of continuously performing the degassing process and the metal film forming process, there may arise a state in which the formation of a metal film begins under such a condition that the temperature of the semiconductor substrate is significantly higher than a required film formation temperature.

The coverage of the metal film in the hole, that is, the covering state of a metal film in a hole formed in a semiconductor substrate becomes worse as the temperature becomes higher of the substrate at the beginning of the formation of the metal film. The tendency of deteriorating the coverage of the metal film becomes significantly larger as the process temperature during the formation of the metal film becomes higher. For this reason, according to the first prior art process, it is not necessarily easy to obtain a good coverage of a metal film in a hole.

In the case of forming a stacked metal film composed of a plurality of metal films different in material, if the formation of a metal film on the underlying metal film thereof begins in a state that a semiconductor substrate is kept at a high temperature, the upper metal film may react with the lower metal film to form reaction products at the boundary between the lower and upper metal films. To ensure the accuracy of photolithography for a stacked metal film, a relatively thin reflection preventive layer having a low reflectance may be formed on the uppermost layer of the stacked metal film. In this case, if reaction products are formed at the boundary between such a reflection preventive layer and the underlying metal film, there may occur groove-like depressions due to the presence of the reaction products in the surface of the reflection preventive layer, that is, in the surface of the stacked metal film.

A stacked metal film is used as a base of metal wiring for a semiconductor device. After completion of the formation of the stacked metal film, the stacked metal film is thus subjected to etching for formation of the metal wiring. If a stacked metal film has groove-like depressions in the surface, foreign matters caused during etching for formation of metal wiring are easy to remain in the depressions, particularly, at sharp corners of end portions of the depressions. The remaining foreign matters will cause an etching failure, leading to short-circuit of a pattern of the metal wiring.

If reaction products formed at the interface between a metal film and the underlying metal film thereof have a high resistivity, the resistance of the metal wiring may increase by the presence of the reaction products. As a result, in formation of a stacked metal film, it is important to prevent formation of reaction products at the boundary between metal films different in material, particularly, between the uppermost metal film and the underlying metal film. According to the second prior art process, however, in formation of a metal film on the underlying metal film, the formation of the upper metal film begins in a state that the semiconductor substrate remains sufficiently heated. That is to say, according to the second prior art process, it is not necessarily easy to form a stacked metal film without formation of reaction products between metal films.

SUMMARY OF THE INVENTION

The present invention has been conceived to solve the previously-mentioned problems, and a general object of the present invention is to provide a novel and useful semiconductor, and an apparatus and a method for manufacturing the same.

A more specific object of the present invention is to provide an apparatus for manufacturing a semiconductor device, which is capable of bringing about a state advantageous for enhancing the coverage of a metal film or preventing occurrence of reaction products between metal films by cooling a semiconductor substrate before formation of the metal film.

The above object of the present invention is achieved by an apparatus for manufacturing a semiconductor device including a metal film formed in a film formation region which contains the interior of a hole formed in the semiconductor substrate. The apparatus includes a degassing unit which carries out a degassing process by heating the semiconductor substrate to a degassing temperature. The apparatus also includes a film forming unit which forms a metal film on the film formation region in a state in which the semiconductor substrate is heated to a film formation temperature. The apparatus further includes a cooling unit for cooling the semiconductor substrate to a cold temperature being lower than the film formation temperature and in a range of −50° C. to 150° C. The cooling process in the cooling unit is carried out after completion of the degassing process and before beginning of the formation of the metal film.

A second object of the present invention is to provide a method for manufacturing a semiconductor device, which is capable of enhancing the coverage of a metal film or preventing occurrence of reaction products between metal films by cooling a semiconductor substrate before formation of the metal film.

The above object of the present invention is achieved by a method for manufacturing a semiconductor device including a metal film formed in a film formation region which contains the interior of a hole formed in the semiconductor substrate. The method includes a step of forming a metal film in the film formation region by heating a semiconductor substrate to a film formation temperature. The method also includes a step of cooling the semiconductor substrate to a cold temperature being lower than the film formation temperature and in a range of −50° C. to 150° C. The cooling process is executed before beginning of the formation of the metal film.

A third object of the present invention is to provide a semiconductor device in which any reaction product is not formed between a plurality of metal films constituting a stacked metal film.

The above object of the present invention is achieved by a semiconductor device having a structure described below. The device includes a stacked metal film composed of a plurality of metal films different in material. The uppermost one of the plurality of metal films is formed after a semiconductor substrate is cooled to a temperature lower than or equal to a reaction temperature at which the uppermost metal film reacts with the underlying metal film. The uppermost metal film is closely bonded with the underlying metal film without the presence of any reaction product at a boundary between the uppermost metal film and the underlying metal film.

Other objects and further features of the present invention will be apparent from the following detailed description when read in conjunction with the accompanying drawings.

DESCRIPTION OF THE PREFERRED EMBODIMENTS

Figure 1:
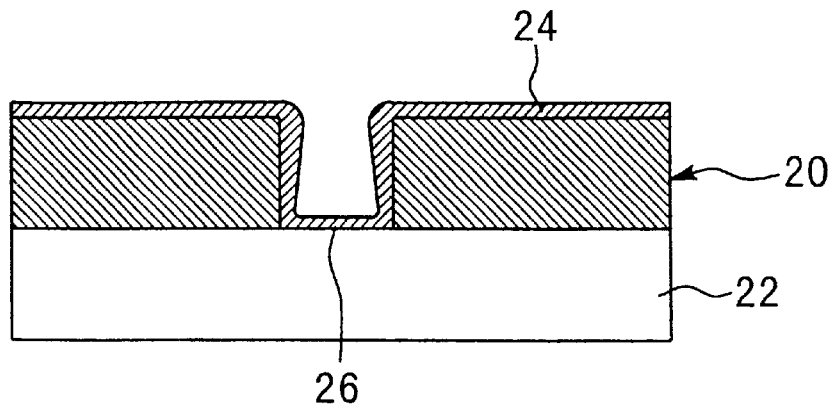
FIG. 1 is a sectional view showing one state of a semiconductor device in a fabrication process there for according to a first embodiment of the present invention.

In the following, principles and embodiments of the present invention will be described with reference to the accompanying drawings. Throughout the drawings, like reference numerals designate like or corresponding parts, and descriptions of such parts are omitted where they are repetitive.

First Embodiment

FIG. 1 shows one state of a semiconductor device 20 in a fabrication process there for according to the first embodiment of the present invention. The semiconductor device 20 in the state shown in FIG. 1 includes a semiconductor substrate 22 and a metal film 24. The semiconductor substrate 22 has a hole 26. The hole 26 is represented by a contact hole, via-hole, or trench.

The metal film 24, made from typically AlCu, is formed on the semiconductor substrate 22 in a specific region containing the interior of the hole 26. To obtain a desired quality of the semiconductor device 20, it is important that the metal film 24 desirably covers the semiconductor device 22 at the bottom of the hole 26 and the inner wall of the hole 26, namely the metal film 24 exhibits a good coverage in the hole 26. This embodiment is characterized in that the metal film 24 is formed in such a manner as to satisfy the above requirement, that is, to obtain a good coverage of the metal film 24 in the hole 26, through use of a fabrication apparatus employing a fabrication method to be described later.

Figure 2:
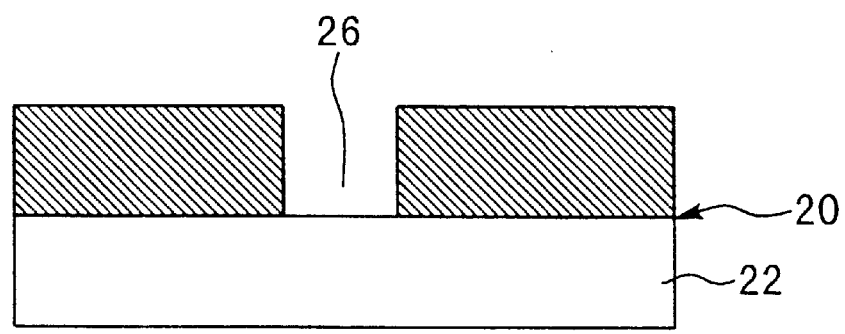
FIG. 2 is a sectional view showing a semiconductor substrate employed as a base of the semiconductor device shown in FIG. 1.

FIG. 2 is a sectional view showing a semiconductor substrate 22 before a formation of the metal film 24. When there remains moisture absorbed by the semiconductor substrate 22 after formation of the hole 26 on the surface of the same, or moisture or gas component contained in an interlayer insulator such as SOG (Spin-on-glass) is blown out during the formation of the metal film 24, the suitable formation of the metal film 24 on the substrate 22 is obstructed. Accordingly, the forming process of the metal film 24 may be desirably carried out after removal of a gas source from the semiconductor substrate 22.

The coverage of the metal film 24 in the hole 26 becomes worse as the ratio of the depth to the width of the hole 26, that is, the aspect ratio of the hole 26 becomes larger; while it becomes better as the hole top, i.e., the diameter of the opening of the hole 26 becomes larger. Accordingly, in the case where the hole 26 having a larger aspect ratio is formed in the semiconductor substrate 22, it may be desirable to begin the forming process of the metal film 24 after the diameter of the hole top is enlarged.

The degassing process for the semiconductor substrate 22 is implemented illustratively by heating the substrate 22. The enlargement of the diameter of the hole top is ensured by subjecting the surface of the semiconductor substrate 22 to sputter etching. In the process of manufacturing the semiconductor device 20, it may be desirable to perform these processes before the forming process of the metal film 24. During the degassing process, the temperature of the semiconductor substrate 22 rises up to approximately 100° C. to 600° C. The temperature of the semiconductor substrate 22 also rises up to a high temperature during sputter etching. As a result, directly after completion of these processes, the semiconductor substrate 20 is kept at a sufficiently high temperature.

Figure 3:
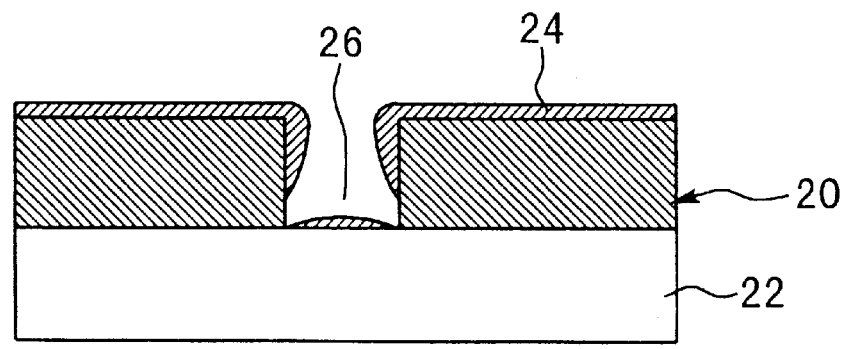
FIG. 3 is a sectional view showing a semiconductor device which is compared with the semiconductor shown in FIG. 1.

FIG. 3 is a sectional view showing a semiconductor device 20 fabricated by a manner in which the formation of the metal film 24 is begun directly after the above degassing and sputter etching processes. If the temperature of the semiconductor substrate 22 is higher than the temperature required for the formation of the metal film 24, the coverage of the metal film 24 is deteriorated. To be more specific, if the formation of the metal film 24 is begun directly after degassing and sputter etching, the coverage of the metal film 24 may be made poor in the hole 26, particularly, at a portion near the bottom of the hole 26, as shown in FIG. 3.

Figure 4:
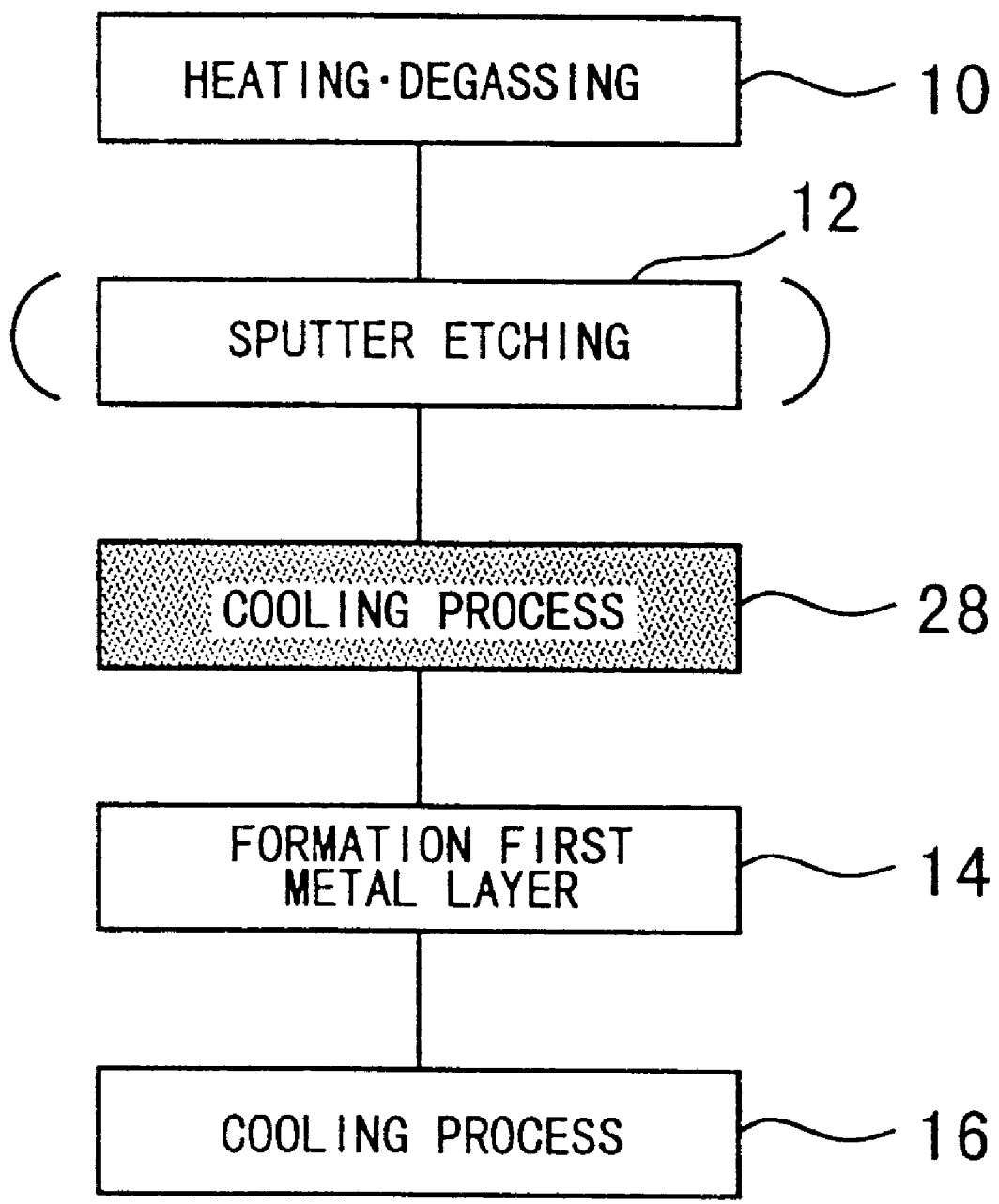
FIG. 4 is a flow chart showing a sequence of processes carried out in the manufacturing process of the semiconductor device shown in FIG. 1.
Figure 26:
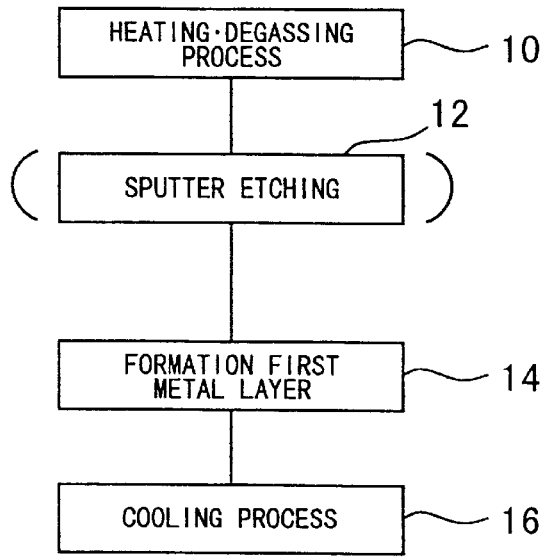
FIG. 26 is a flow chart showing a first example of a sequence of processes carried out in the former manufacturing process of a semiconductor device.
Figure 27:
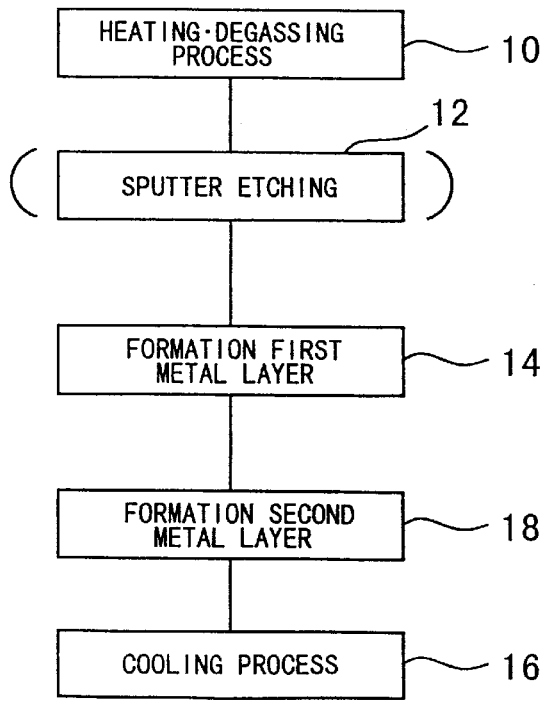
FIG. 27 is a flow chart showing a second example of a sequence of processes carried out in the former manufacturing process of a semiconductor device.

FIG. 4 shows a flow chart of a sequence of processes carried out in the first embodiment for preventing deterioration of the above-described coverage of a metal film 24. As the case of the first prior art process (see FIG. 26), the sequence of processes shown in FIG. 4 begins with a step 10.

At the step 10 is performed a degassing process in which a gas contained in a semiconductor substrate 22 is released by heating the substrate 22 to a specific degassing temperature in a vacuum atmosphere. With this process at the step 10, the semiconductor substrate 22 is heated to a temperature of approximately 100° C. to 600° C.

The process goes on to a step 12 at which is performed a sputter etching for enlarging the diameter of the hole top as required. With the treatment at the step 12, the semiconductor substrate 22 is heated to a temperature of approximately 100° C. to 600° C. It should be noted that the treatment at the step 12 may be omitted.

In the fabrication method according to the first embodiment, a process at a step 28 is performed after completion of the process at the step 10 or 12 and before beginning of the formation of the metal film 24. At the step 28 is performed a cooling process of the semiconductor substrate 22. To be more specific, the semiconductor substrate 22 is cooled to a specific cooled temperature being in a range of −50° C. to 150° C. and lower than or equal to the temperature required for the formation of the metal film 24 in the step 28.

Following the cooling process of the semiconductor substrate 22, the process proceeds to a step 14. At the step 14 is performed the forming process of the metal film 24 on the surface of the semiconductor substrate 22 in a state in which the substrate 22 is heated to a specific film formation temperature.

The process goes on to a step 16 at which is performed a cooling process of the semiconductor substrate 22 remaining heated at the film formation temperature to room temperature. Thus the process of forming the metal film 24 is completed.

As described above, according to the method for manufacturing a semiconductor device in the first embodiment, the formation of the metal film 24 begins after the suitable cooling of the semiconductor substrate 22. If the semiconductor substrate 22 is cooled to a temperature lower than or equal to the film formation temperature required for the formation of the metal film 24 at the beginning of the formation process, a good coverage of the metal film 24 can be obtained even in a hole having a large aspect ratio. Further, by completing the cooling process of the semiconductor substrate 22 before beginning of the forming process of the metal film, the semiconductor substrate 22 can be efficiently heated after beginning of the forming process, thereby the metal film 24 is efficiently formed. Accordingly, the first embodiment is capable of efficiently forming the metal film 24 exhibiting a good coverage in the hole 26.

A fabrication apparatus suitable for carrying out the above-described fabrication method will be described below with reference to FIG. 5.

Figure 5:
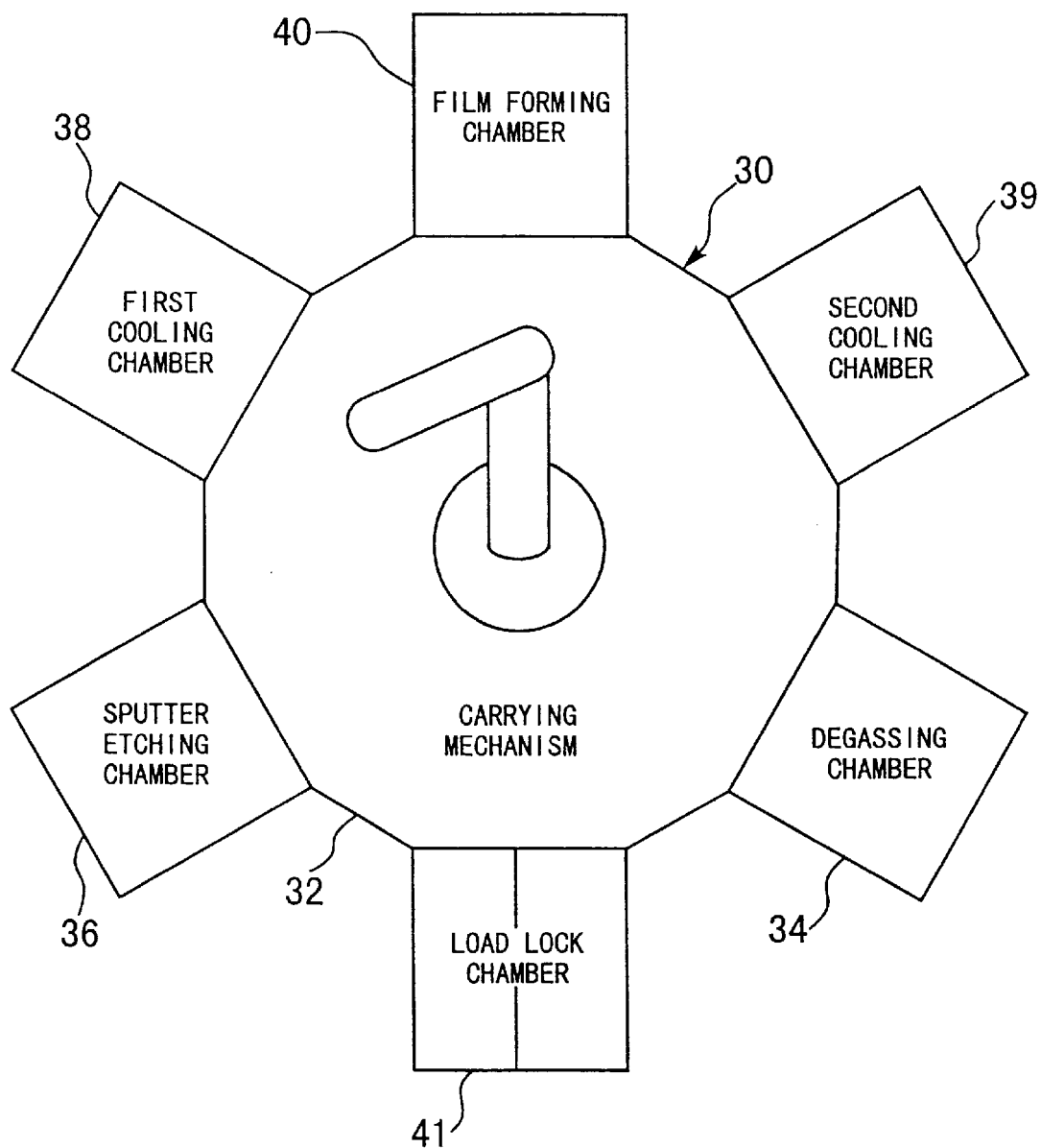
FIG. 5 is a plane view of a manufacturing apparatus suitable for the fabrication of the semiconductor device shown in FIG. 1.

FIG. 5 is a plane view of a fabrication apparatus 30 for a semiconductor device according to the first embodiment. The fabrication apparatus 30 includes a carrying mechanism 32 at its central portion. Around the carrying mechanism 32 are arranged a degassing chamber 34, a sputter etching chamber 36, first and second cooling chambers 38 and 39, film forming chamber 40, and a load lock chamber 41. Each of these chambers 34, 36, and 38 to 41 includes a mechanism for shielding its internal space from a space of the carrying mechanism 32, a mechanism for evacuating its internal space, and a mechanism for allowing carry-in/carry-out of the semiconductor substrate 22 by the carrying mechanism 32.

The fabrication apparatus 30 includes a control unit for continuously and interiorly performing the sequence of processes shown in FIG. 4. When the fabrication apparatus 30 is required to start operation, the semiconductor substrate 22 (in the state shown in FIG. 2) set on the fabrication apparatus 30 is first carried in the degassing chamber 34 by the carrying mechanism 32. In the degassing chamber 34 is performed the degassing process in accordance with a specific condition. The semiconductor substrate 22 is then carried in the sputter etching chamber 36 by the carrying mechanism 32. In the sputter etching chamber 36 is performed the sputter etching in accordance with a specific condition.

After completion of the sputter etching, the semiconductor substrate 22 is carried in the first cooling chamber 38 by the carrying mechanism 32 and held in the chamber 38 for a specific time. The time during which the semiconductor substrate 22 is held in the first cooling chamber 38 is experimentally determined as a time required for cooling the semiconductor substrate 22 to a specific cooled temperature. Accordingly, the semiconductor substrate 22 can be suitably cooled to a target cooled temperature by the above cooling process.

After completion of the cooling process, the semiconductor substrate 22 is carried in the film forming chamber 40 by the carrying mechanism 32. In the film forming chamber 40 is performed a film forming process in accordance with a specific condition. After that, the semiconductor substrate 22 is cooled again in the second cooling chamber 39, and is then carried out of the fabrication apparatus 30. In this way, according to the fabrication apparatus 30 in the first embodiment, the sequence of processes shown in FIG. 4 can be automatically, continuously performed, and accordingly, the metal film 24 exhibiting a good coverage can be efficiently formed.

It may be desirable that the cooling process before film formation (i.e., the process of step 28) and the cooling process after film formation (i.e., the process of the step 16) are performed in different chambers in order to enhance the processing ability of the apparatus 30. For this reason, the fabrication apparatus 30 has two cooling chambers. Similarly, if different kinds of films are required to be formed, it is efficient to form the films in different chambers. In this regard, in a case where different kinds of films are required to be formed, the fabrication apparatus 30 may be provided with a plurality of film forming chambers.

While the above-described fabrication apparatus 30 is provided with the sputter etching chamber 36, the present invention is not limited thereto. That is to say, as described above, sputter etching can be omitted in the fabrication method in the first embodiment. If sputter etching is omitted, the sputter etching chamber 36 may be of course omitted from the fabrication apparatus 30.

The structural examples applicable to the first and second cooling chambers 38 and 39 provided in the fabrication apparatus 30 in the first embodiment will be described with reference to FIGS. 6 to 12.

Figure 6:
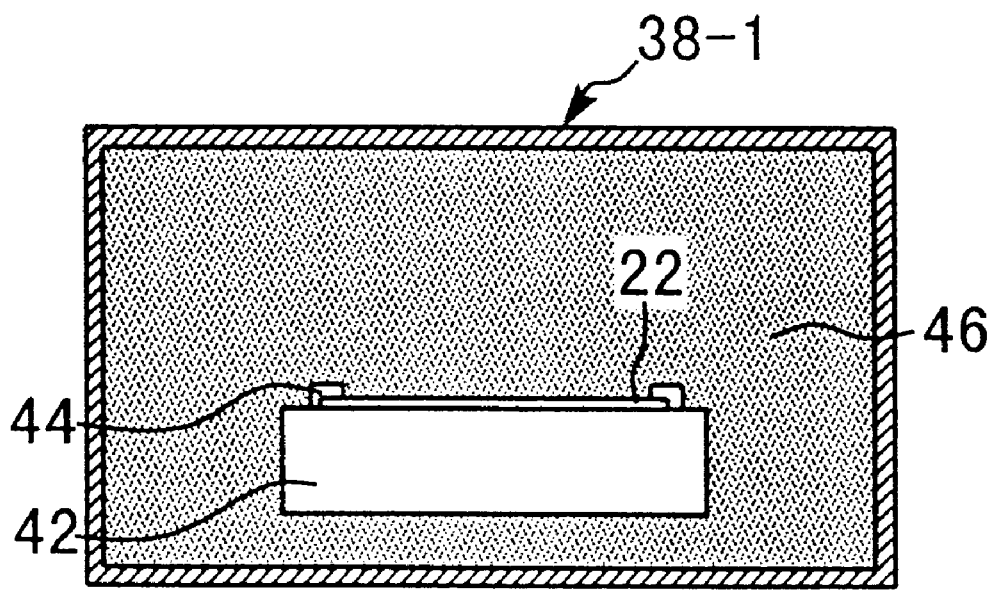
FIG. 6 is a sectional view showing a first example applicable to cooling chambers provided to the manufacturing apparatus shown in FIG. 5.

FIG. 6 shows a first structural example applicable to the cooling chambers 38 and 39. Hereinafter, a cooling chamber having the structure shown in FIG. 6 is denoted by reference numeral 38-1. As shown in FIG. 6, the cooling chamber 38-1 includes a stage 42 and a holder 44 for holding the semiconductor substrate 22. The cooling chamber 38-1 is filled with an inert gas 46 whose temperature is lower than a target cold temperature. The cooling chamber 38-1 is allowed to efficiently cool the semiconductor substrate 22 using the inert gas 46 as a cooling medium without imparting any damage to the substrate 22.

Figure 7:
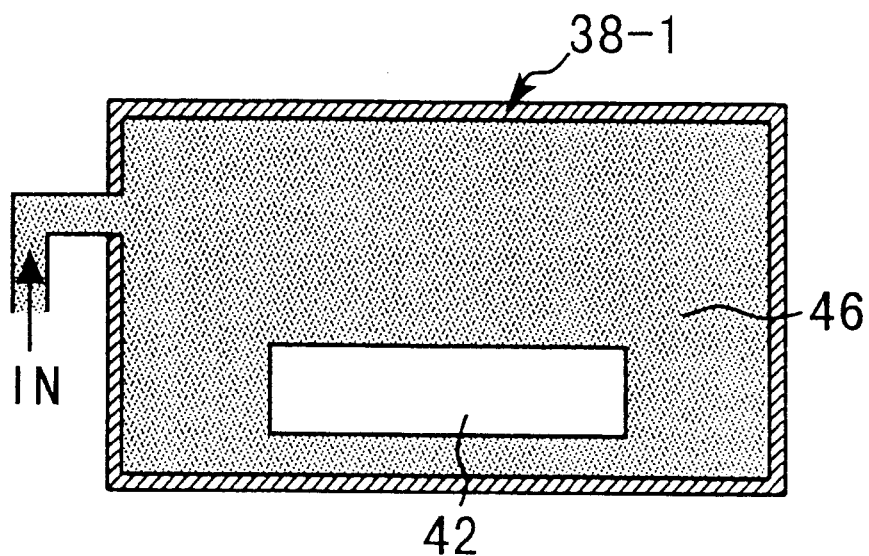
FIG. 7 is a sectional view showing a first structural example for implementing the function of the cooling chamber shown in FIG. 6.
Figure 8:
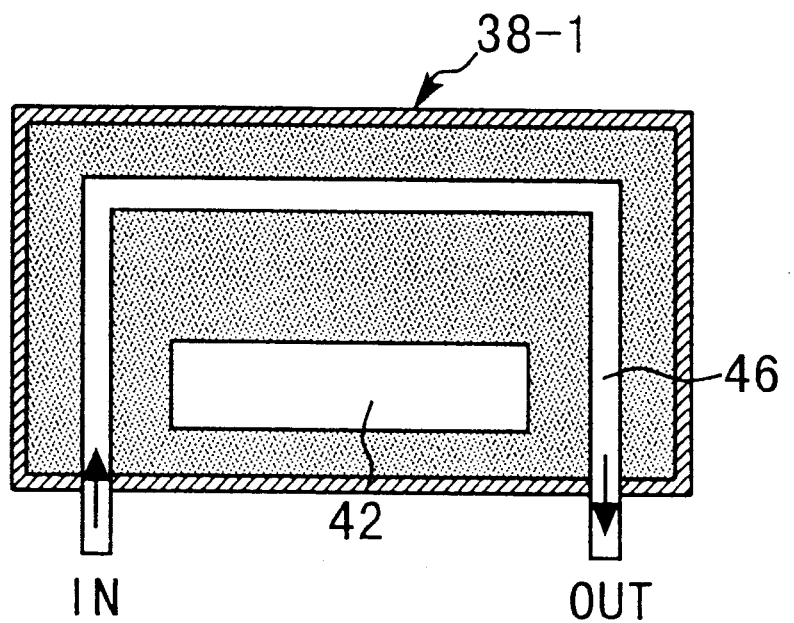
FIG. 8 is a sectional view showing a second structural example for implementing the function of the cooling chamber shown in FIG. 6.

FIGS. 7 and 8 each show a concrete structural example for realizing a function of the cooling chamber 38-1, i.e., a function of filling the cooling chamber 38-1 with a low temperature inert gas. FIG. 7 shows the example which ensures the foregoing function by directly introducing a low temperature inert gas in the cooling chamber 38-1. FIG. 8 shows the example in which piping is provided in the cooling chamber 38-1, and a low temperature fluid such as liquid nitrogen is allowed to flow in the piping, thereby cooling an inert gas filling the cooling chamber 38-1 by heat exchange between the inert gas and the low temperature fluid. With these structures, the cooling chamber 38-1 can be suitably filled with an atmosphere of a low temperature inert gas.

Figure 9:
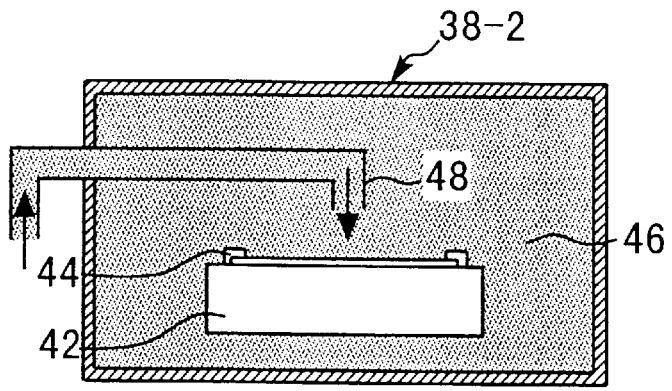
FIG. 9 is a sectional view showing a second example applicable to cooling chambers provided to the manufacturing apparatus shown in FIG. 5.

FIG. 9 shows a second structural example applicable to the cooling chambers 38 and 39. Hereinafter, a cooling chamber having the structure shown in FIG. 9 is assigned with reference numeral 38-2. As shown in FIG. 9, the cooling chamber 38-2 includes an inert gas injecting port 48 opening to the surface of the semiconductor substrate 22 held on the stage 42 by the holder 44. The inert gas injecting port 48 injects a low temperature inert gas, which is supplied from an external source, to the surface of the semiconductor substrate 22. The cooling chamber 38-2 enclose the low temperature inert gas 46 injected from the inert gas injecting port 48 inside thereof. Such a structure allows efficient heat exchange between the semiconductor substrate 22 and the low temperature inert gas injected to the surface of the same. The cooling chamber 38-2 shown in FIG. 9 is capable of cooling the semiconductor substrate 22 more efficiently than the cooling chamber 38-1 shown in FIG. 6.

Figure 10:
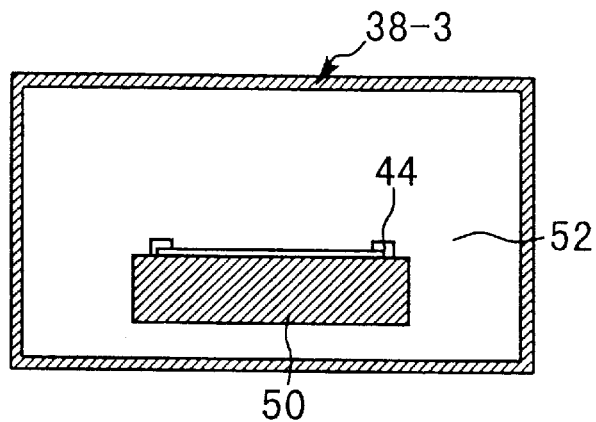
FIG. 10 is a sectional view showing a third example applicable to cooling chambers provided to the manufacturing apparatus shown in FIG. 5.

FIG. 10 shows a third structural example applicable to the cooling chambers 38 and 39. Hereinafter, a cooling chamber having the structure shown in FIG. 10 is denoted by reference numeral 38-3. As shown in FIG. 10, the cooling chamber 38-3 includes a stage 50. The stage 50 is cooled to a temperature lower than a target cold temperature. In the cooling chamber 38-3, the semiconductor substrate 22 is kept in a state being in close-contact with the stage 50. The cooling chamber 38-3 is also filled with an inert gas 52. With this cooling chamber 38-3, the semiconductor substrate 22 can be efficiently cooled by exchanging heat with the stage 50 and the inert gas 52.

In the above description, the cooling chamber 38-3 is filled with the inert gas 52; however, the structure of the cooling chamber 38-3 is not limited thereto. That is to say, since the main heat exchange source in the cooling chamber 38-3 is the stage 50, if it is convenient to keep the interior of the cooling chamber 38-3 in vacuum, the inert gas 52 may be not introduced in the cooling chamber 38-3.

Figure 11:
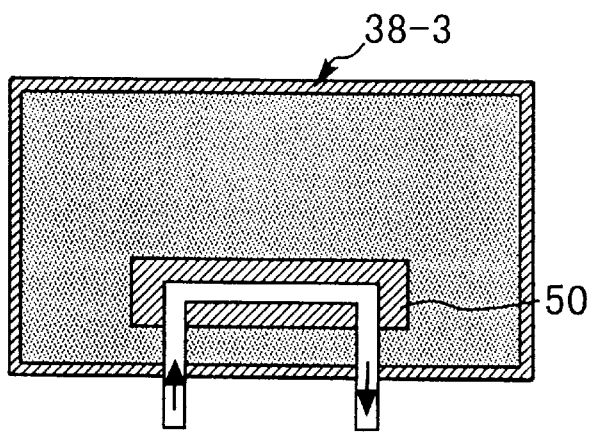
FIG. 11 is a sectional view showing a first structural example for implementing the function of the cooling chamber shown in FIG. 10.
Figure 12:
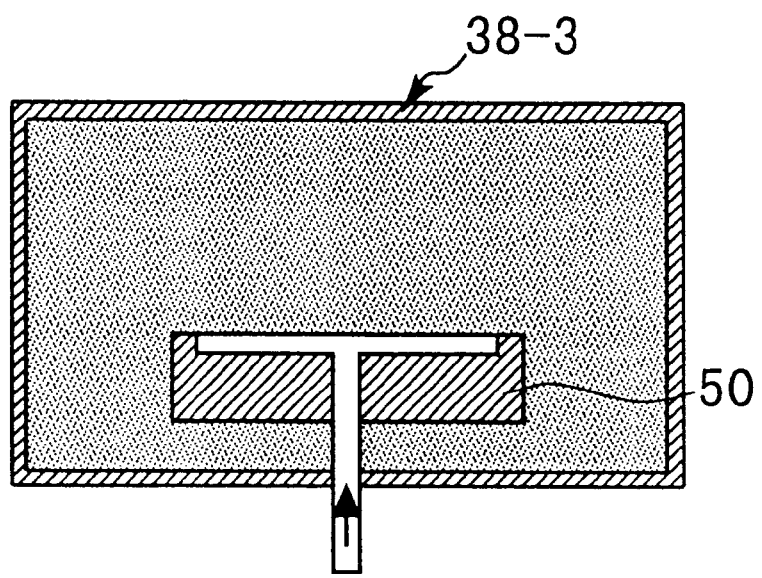
FIG. 12 is a sectional view showing a second structural example for implementing the function of the cooling chamber shown in FIG. 10.

FIGS. 11 and 12 each show a concrete structural example for realizing a function of the cooling chamber 38-3, i.e., a function of cooling the stage 50 to a temperature lower than or equal to a target cold temperature. FIG. 11 shows the example in which the above function is realized by allowing a cooling medium such as liquid nitrogen or low temperature inert gas to flow in the stage 50. FIG. 12 shows the example in which the above function is implemented by allowing a low temperature inert gas to flow in the stage 50 and also a further improved cooling efficiency is realized by blowing the inert gas to the reverse side of the semiconductor substrate. With these structures, the stage 50 can be suitably cooled to a temperature lower than or equal to a target cold temperature. The structure shown in FIG. 12 further realizes a function of filling the cooling chamber 38-3 with an atmosphere of a low temperature inert gas.

As described above, according to this embodiment, the semiconductor substrate 22 is cooled in the specialized cooling chamber (i.e., first cooling chamber 38) prior to the formation of the metal film 24. The above cooling process, however, may be performed not in the specialized cooling chamber but in the degassing chamber 34, sputter etching chamber 36, or layer forming chamber 40.

For example, if the degassing chamber 34 is of a type in which the semiconductor substrate 22 is heated by means of lamp heating, a desired cooling process can be realized by exposing, after completion of lamp heating, the substrate 22 to a low temperature inert gas in the degassing chamber 34, or blowing, after completion of lamp heating, a low temperature inert gas to the substrate 22 in the degassing chamber 34. Even in a chamber of a type in which the semiconductor substrate 22 is heated by a heater or by blowing a high temperature gas to the substrate 22, a desired cooling process can be realized by exposing, after such heating processes, the substrate 22 to a low temperature inert gas in the chamber.

The semiconductor substrate 22 is held on stages heated at a high temperature in the degassing chamber 34, sputter etching chamber 36 and film forming chamber 40. Accordingly, in a case where the cooling process is performed in such a chamber, it is suitable to begin the cooing process with the semiconductor substrate 22 held at a position apart from the stage.

Figure 13:
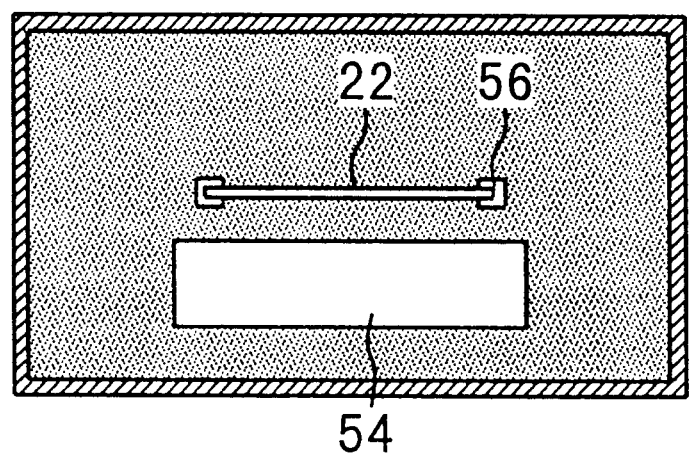
FIG. 13 is a sectional view showing a structural example of a chamber having a function implementing a heating process and a cooling process.

FIG. 13 shows one chamber structural example satisfying the above requirement. In the chamber shown in FIG. 13, a stage 54 is heated to a specific temperature before beginning of the cooling process. In the chamber shown in FIG. 13, there is provided a holder 56 capable of holding the semiconductor substrate 22 at a position apart from the stage 54. The semiconductor substrate 22 held in the state shown in FIG. 13 can be efficiently cooled even if the stage 54 is kept at a high temperature. That is to say, the chamber having the structure shown in FIG. 13 allows the cooling process to be efficiently performed although not being a specialized cooling chamber.

Second Embodiment

Hereinafter, a second embodiment of the present invention will be described with reference to FIGS. 14 to 17.

Figure 14:
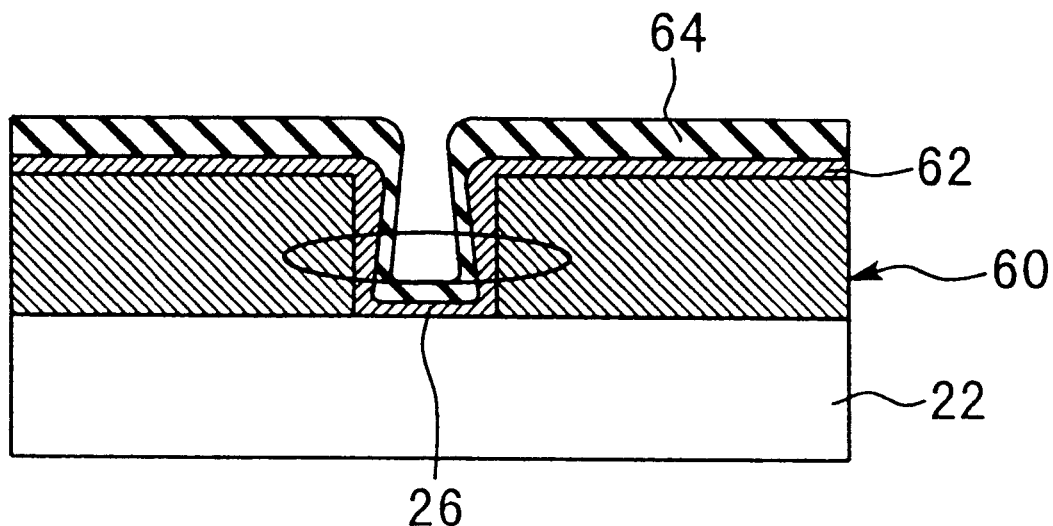
FIG. 14 is a sectional view showing one state of a semiconductor device in a fabrication process there for according to a second embodiment of the present invention.

FIG. 14 shows one state of a semiconductor device 60 in the fabrication process there for according to the second embodiment of the present invention. In the state shown in FIG. 14, the semiconductor device 60 includes a first metal film 62 formed on the semiconductor substrate 22, and a second metal film 64 formed on the first metal film 62.

The second metal film 64, which forms a main part of metal wiring, is made of AlCu. The first metal film 62 is a barrier metal film for preventing reaction between AlCu (second metal film 64) and the semiconductor substrate 22 and preventing diffusion of AlCu to the substrate 22. The first metal film 62 is made from Ti or TiN. To obtain a desired quality of the semiconductor device 60, it is important for each of the first and second metal films 62 and 64 to exhibit a good coverage in a hole 26, particularly, at a portion near the hole bottom (which is indicated by an elliptical mark in FIG. 14). This embodiment is characterized in that each of the first and second metal films 62 and 64 is formed in such a manner as to satisfy the above requirement, namely, to obtain a good coverage in the hole 26, in accordance with a fabrication method to be described later.

Figure 15:
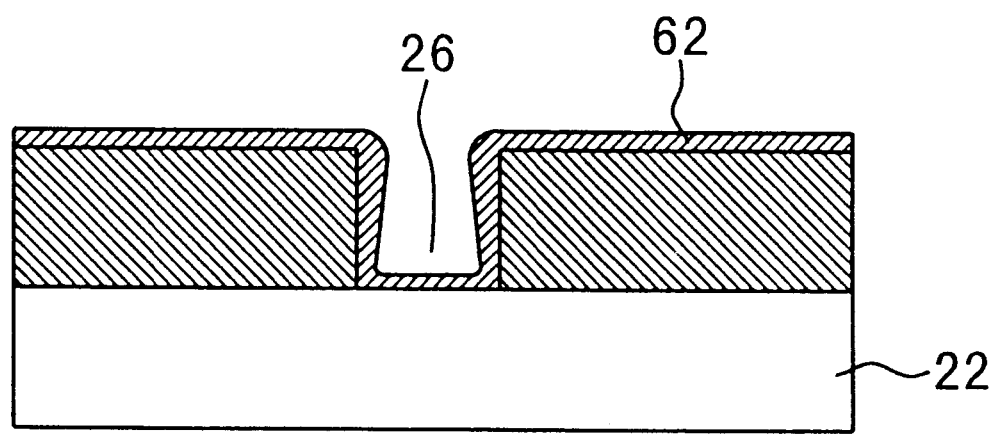
FIG. 15 is a sectional view showing a semiconductor substrate employed as a base of the semiconductor device shown in FIG. 14.
Figure 16:
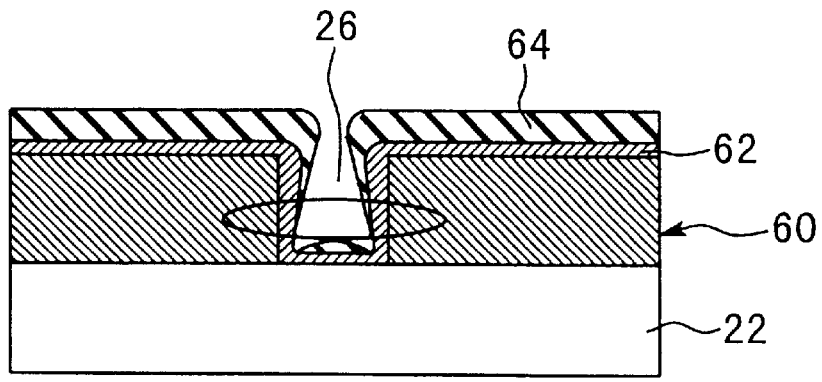
FIG. 16 is a sectional view showing a semiconductor device which is compared with the semiconductor shown in FIG. 14.

FIG. 15 is a sectional view of a state of the semiconductor substrate 22 before the formation of the second metal film 64, that is, directly after the formation of the first metal film 62. During the formation of the first metal film 62, the semiconductor substrate 22 is heated to a temperature of approximately 100° C. to 600° C. As described above, if the temperature of the semiconductor substrate 22 is over the temperature required for the formation a metal film upon beginning of the formation of the metal film, the coverage of the metal film becomes poor. Accordingly, if the formation of the second metal film 64 begins directly after the formation of the first metal film 62, as shown in FIG. 16, the coverage of the second metal film 64 may be made poor in the hole 26, particularly, at a portion indicated by an elliptical mark near the hole bottom.

Figure 17:
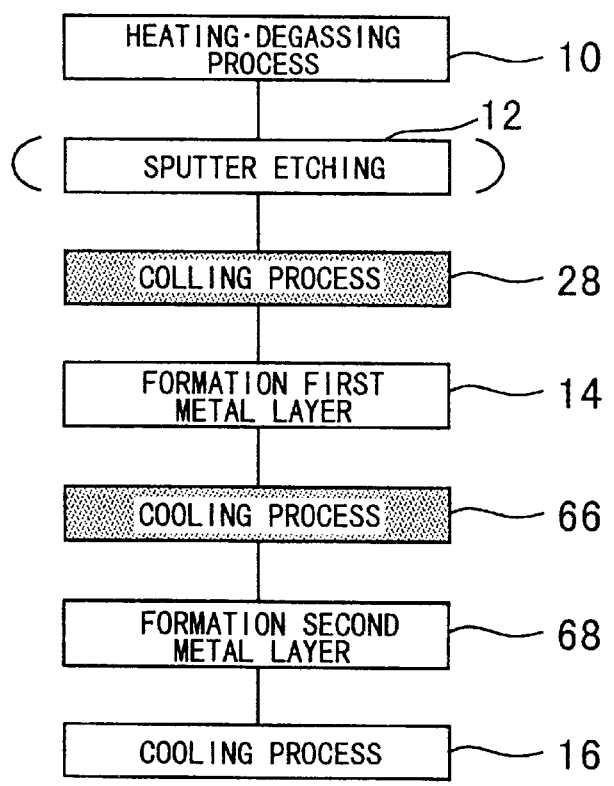
FIG. 17 is a flow chart showing a sequence of processes carried out in the manufacturing process of the semiconductor device shown in FIG. 14.

FIG. 17 shows a flow chart of a sequence of processes performed in the second embodiment for preventing the above mentioned deterioration of the coverage of the metal film in the hole. As shown in FIG. 17, in the fabrication method according to the second embodiment, like the metal film 24 in the first embodiment, the first metal film 62 is formed by way of the steps 10, 12, 28 and 14. In the second embodiment, these processes are followed by a treatment at a step 66.

At the step 66 is performed the process of cooling the semiconductor substrate 22. To be more specific, the semiconductor substrate 22 is cooled, at the step 66, to a specific cold temperature being in a range of −50° C. to 150° C. and lower than or equal to a temperature required for formation of the second metal film 64.

Following the cooling process of the semiconductor substrate 22, a process at a step 68 is performed. At the step 68 is performed the process of forming the second metal film 64 on the surface of the first metal film 62 in a state in which the semiconductor substrate 22 is heated to the specific film formation temperature. After that, a process of cooling the semiconductor substrate 22 to room temperature (step 16) is performed, thus completing the processes of forming the first and second metal films 62 and 64.

As described above, according to the second embodiment, the formation of the second metal film 64 begins after the process of suitably cooling the semiconductor substrate 22. Since the semiconductor substrate 22 is cooled to a temperature lower than or equal to the film formation temperature upon beginning of the formation of the second metal film 64, the second metal film 64 can be formed in such a manner as to exhibit a good coverage even in the hole 26 having a large aspect ratio. Also, by completing the process of cooling the semiconductor substrate 22 before beginning of the layer forming treatment, the semiconductor substrate 22 can be efficiently heated after beginning of the film forming process, to thereby efficiently form the second metal film 64. As a result, according to the fabrication method practiced as the second embodiment, each of the first and second metal films 62 and 64 can be efficiently formed in such a manner as to exhibit a good coverage in the hole 26.

A modification of the above-described second embodiment will be described below with reference to FIGS. 18 and 19.

While in the fabrication method according to the second embodiment is performed the process of cooling the semiconductor substrate 22 before the formation of the first metal film 62 and before the formation of the second metal film 64, the present invention is not limited thereto. The process of cooling the semiconductor substrate 22 may be performed only before the formation of either the first metal film 62 or the second metal film 64.

Figure 18:
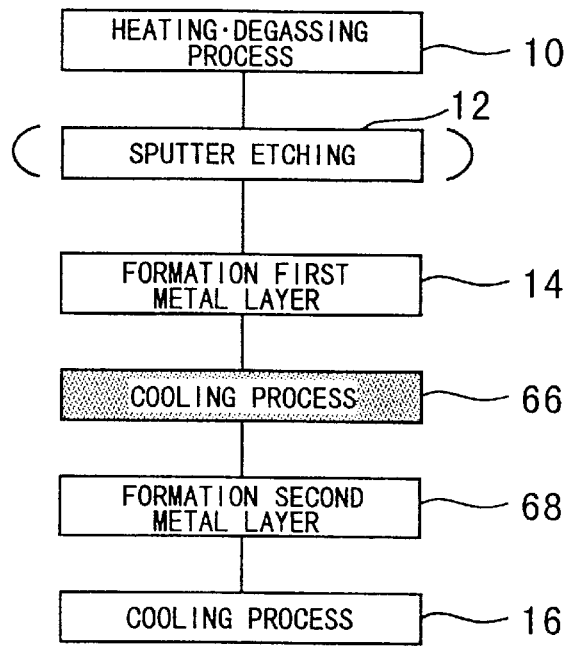
FIG. 18 is a flow chart showing a first modified example of a sequence of processes carried out in the manufacturing process of the semiconductor device shown in FIG. 14.
Figure 19:
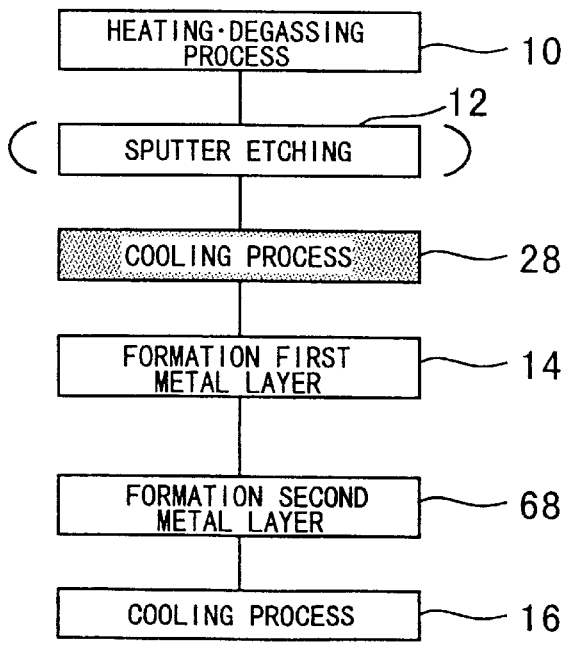
FIG. 19 is a flow chart showing a second modified example of a sequence of processes carried out in the manufacturing process of the semiconductor device shown in FIG. 14.

FIG. 18 shows a flow chart of a sequence of processes in which the process of cooling the semiconductor substrate 22 is performed only before the formation of the second metal film 64. FIG. 19 shows a flow chart of a sequence of processes in which the process of cooling the semiconductor substrate 22 is performed only before the formation of the first metal film 62. The desirable effect of the present invention can be given for the processes carried out in accordance with each of these flow charts shown in FIGS. 18 and 19.

Third Embodiment

Hereinafter, a third embodiment of the present invention will be described with reference to FIGS. 20 and 21.

Figure 20:
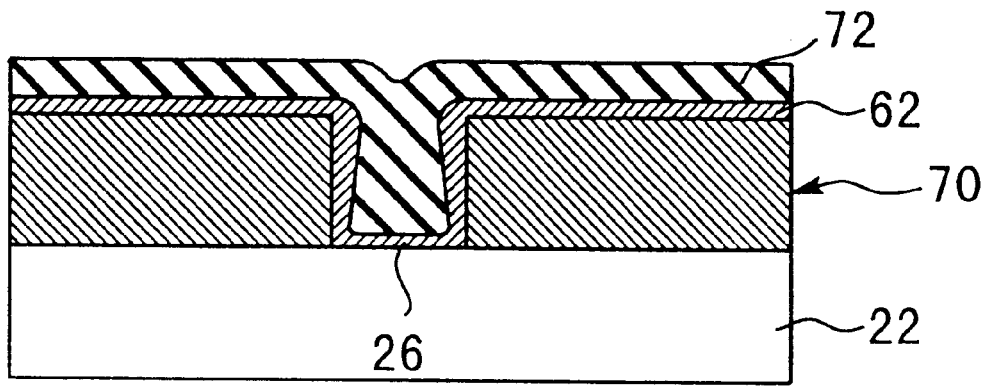
FIG. 20 is a sectional view showing one state of a semiconductor device in a fabrication process there for according to a third embodiment of the present invention.

FIG. 20 shows one state of a semiconductor device 70 in the fabrication process there for according to the third embodiment of the present invention. As shown in FIG. 20, the semiconductor device 70 in this embodiment includes a second metal film 72 formed on a first metal film 62. The second metal film 72 has a large thickness enough to fill a hole 26 and to be used as a base material of metal wiring. The semiconductor device 70 is realized by increasing the thickness of the second metal film 64 in the semiconductor device 60 according to the second embodiment.

To be more specific, the semiconductor device 70 is realized by executing reflow process in a chamber kept at a high temperature of approximately 400° C. to 600° C. so at to increase the thickness of the second metal film 64 (in the semiconductor device 60 according to the second embodiment) at a side wall section on the hole side or additionally depositing AlCu on the second metal film 64 so as to increase the thickness of the same while employing the semiconductor device 60 according to the second embodiment as a seed layer.

Figure 21:
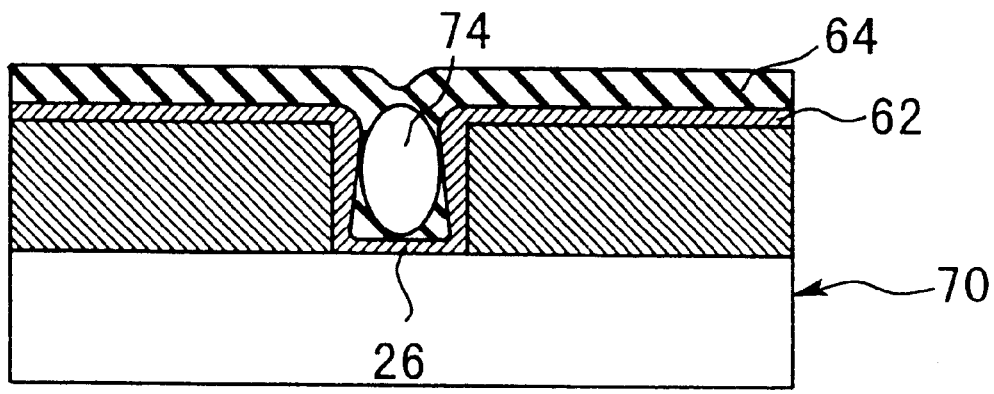
FIG. 21 is a sectional view showing a semiconductor device which is compared with the semiconductor shown in FIG. 20.

FIG. 21 is a sectional view showing the semiconductor device 70 fabricated on the basis of the semiconductor device 60 in which each of the first and second metal films 62 and 64 does not exhibit a good coverage. In the case where each of the first and second metal films 62 and 64 does not exhibit a good coverage, it is difficult for AlCu to enter the hole 26 upon reflow or additional deposition of AlCu. In such a situation, as shown in FIG. 21, there may occur a void 74 in the hole 26.

On the contrary, the semiconductor device 70 in the third embodiment is fabricated on the basis of the semiconductor device 60 in which each of the first and second metal films 62 and 64 exhibits a good coverage. Accordingly, in the semiconductor device 70, as shown in FIG. 20, the hole 26 is desirably filled with the second metal film 72. As a result, the semiconductor device 70 in the third embodiment exhibits stable electric characteristics.

Fourth Embodiment

Hereinafter, a fourth embodiment of the present invention will be described with reference to FIGS. 22 to 25.

Figure 22:
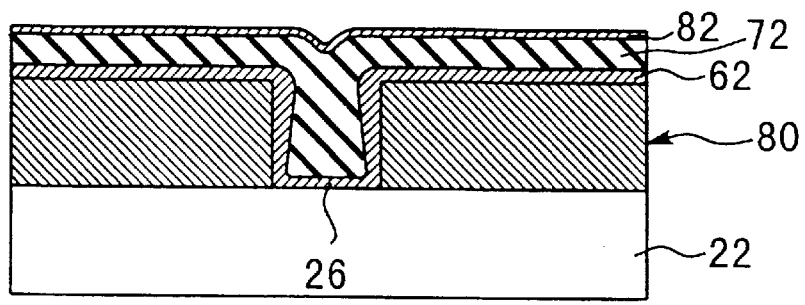
FIG. 22 is a sectional view showing one state of a semiconductor device in a fabrication process there for according to a fourth embodiment of the present invention.

FIG. 22 shows one state of a semiconductor device 80 in a fabrication process there for according to the fourth embodiment of the present invention. As shown in FIG. 22, the semiconductor device 80 in the fourth embodiment includes a second metal film 72 formed on a first metal film 62 in such a manner as to fill a hole 26, and a third metal film 82 formed on the second metal film 72. The semiconductor device 80 is realized on the basis of the semiconductor device 70 in the third embodiment. That is to say, the third metal film 82 is formed on the surface of the second metal film 72 in the semiconductor device 70 according to the third embodiment.

The third metal film 82 is a reflection preventive layer made of Ti or TiN. The third metal film 82 is the uppermost layer of a stacked metal film formed in the semiconductor device 80, and has a reflectance lower than that of the main metal of metal wiring, that is, AlCu forming the second metal film 72. Accordingly, the formation of the third metal film 82 as the uppermost layer of the stacked metal film is effective to suppress reflection of light upon photolithography for the stacked metal film and hence to improve the shape of a pattern of the metal wiring.

Figure 23:
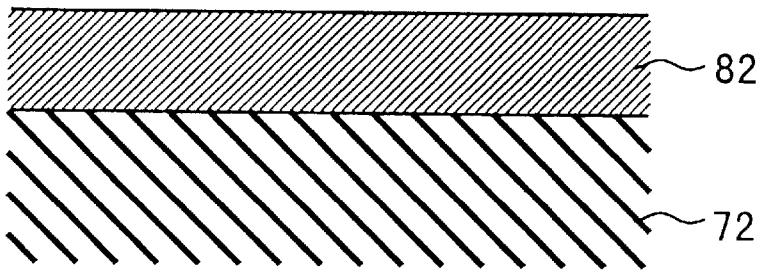
FIG. 23 is a enlarged sectional view showing a boundary between a second metal film and a third metal film included in the semiconductor device shown in FIG. 22.

FIG. 23 is an enlarged view of the boundary between the second and third metal films 72 and 82 of the semiconductor device 80 in this embodiment. As shown in FIG. 23, the second and third metal films 72 and 82 of the semiconductor device 80 are in close-contact with each other without any reaction product being present at the boundary therebetween. In the fourth embodiment, the third metal film 82 has a smooth surface. A mark for alignment checking is formed on the substrate 22 simultaneously with the formation of the hole 26. In a case where the metal films 72 and 82 are formed on the mark, particularly, when it is intended to perfectly fill the hole 26 with the metal film by reflow or high temperature sputter, the readout of the mark becomes difficult. If there significantly appears a pattern other than the alignment checking mark (i.e., grain or small irregularity) around the mark, the readout of the mark becomes more difficult, whereby the inspecting accuracy is deteriorated. On the contrary, according to the third embodiment, the alignment checking mark provided on the semiconductor device 80 can be easily read out. As a result, the semiconductor device 80 is allowed to enhance the positioning accuracy of the pattern of the metal wiring.

When the second metal film 72 is formed by a reflow process, the temperature required for formation thereof is approximately in a range of 400° C. to 600° C. as described above. Meanwhile, when the second metal film 72 is formed by additional deposition using sputtering, the temperature required for formation thereof is higher several ° C. to 100° C. than the above range of 400° C. to 600° C. Consequently, if the formation of the third metal film 82 begins directly after the formation of the second metal film 72, there occurs a situation in which both the metal films 72 and 82 are apt to react with each other at the initial stage of the formation of the third metal film 82, that is, at the stage in which the boundary between the second and third metal films 72 and 82 is formed.

Figure 24:
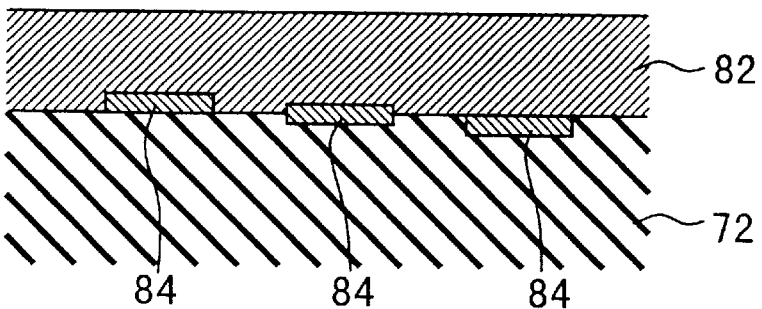
FIG. 24 is a enlarged sectional view showing a boundary between a second metal film and a third metal film included in a semiconductor device which is compared with the semiconductor device shown in FIG. 22.
Figure 25:
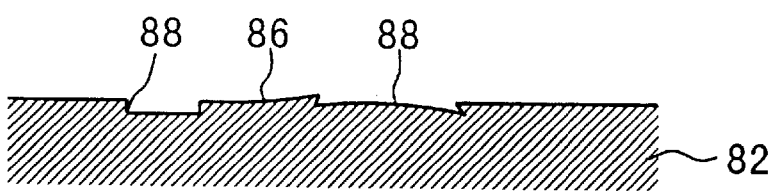
FIG. 25 is a enlarged sectional view showing a surface of the third metal film included in the semiconductor device compared with the semiconductor device shown in FIG. 22.

FIG. 24 is a sectional view of the second and third metal films 72 and 82 formed by a manner in which the formation of the third metal film 82 begins directly after the formation of the second metal film 72. FIG. 25 is an enlarged view of the surface of the third metal film 82 formed in the same manner as described above. As shown in FIG. 24, when the third metal film 82 is formed in such a process, it reacts with the second metal film 72 to form reaction products 84 at the boundary between the second and third metal films 72 and 82. In general, such a reaction product 84 has a resistivity higher than that of the second metal film 72. As a result, the formation of the reaction products 84 causes an inconvenience in which the electric resistance of metal wiring formed of the stacked metal film increases.

The third metal film 82 is a thin layer formed for suppressing the reflectance of the stacked metal film. If the reaction products 84 are formed at the boundary between the second metal film 72 and the thin third metal film 82, trapezoidal projections 86 and groove-like depressions 88 are formed on and in the surface portion of the third metal film 82 as shown in FIG. 25. When the stacked metal film in such a state is etched, foreign matters caused by etching remain at end portions of the projections 86 or the like, tending to cause short-circuit of a pattern of metal wiring formed of the stacked metal film. When the projections 86 and depressions 88 are formed on and in the surface portion of the third metal film 82, it becomes difficult to read out a alignment checking mark, tending to degrade the positioning accuracy of the pattern of the metal wiring. In this way, the manner of beginning the formation of the third metal film 82 directly after the formation of the second metal film 72 causes the various inconveniences in degrading the characteristics of the semiconductor device 80.

In the process of manufacturing the semiconductor device 80 according to the fourth embodiment, the process of cooling the semiconductor substrate 22 is performed after completion of the formation of the second metal film 72, and the formation of the third metal film 82 begins after the temperature of the semiconductor substrate 22 is lowered to a temperature at which the metal (AlCu) forming the second metal film 72 does not react with the metal (Ti or TiN) forming the third metal film 82.

On the contrary, the semiconductor device 70 in the fourth embodiment is fabricated on the basis of the semiconductor device 60 in which each of the first and second metal films 62 and 64 exhibits a good coverage. Accordingly, in the semiconductor device 70, as shown in FIG. 20, the hole 26 is desirably filled with the second metal film 72. As a result, the semiconductor device 70 in the fourth embodiment exhibits stable electric characteristics.

According to the above fabrication method, it is possible to prevent formation of the reaction products 84 at the boundary between the second and third metal films 72 and 82 and hence to avoid occurrence of various inconveniences due to the reaction products 84. Also, according to the above fabrication method, since the formation of the third metal film 82 begins after completion of the process of cooling the semiconductor substrate 22, the semiconductor substrate 22 can be efficiently heated during the formation of the third metal film 82, to thereby efficiently form the third metal film 82. As a result, according to the method for manufacturing a semiconductor device in the fourth embodiment, the semiconductor device 80 having good electric characteristics can be efficiently fabricated at a high yield.

The major benefits of the present invention described above are summarized as follows:

According to the first aspect of the present invention, since the formation of a metal film begins after a semiconductor substrate heated by a degassing treatment is cooled to a temperature lower than a film formation temperature, it is possible to ensure a good coverage of the metal film in a hole. Also, since the target cooling temperature is not excessively low, it is possible to obtain a desirable economical effect. Further, since the degassing process, the cooling process, and the film forming process can be continuously performed, it is possible to obtain a high productivity.

According to the second aspect of the present invention, the degassing process, cooling process, and film forming process are performed in different chambers, and the degassing process and film forming process are performed at higher temperatures as compared with the cooling process. Accordingly, by use of the fabrication apparatus of the present invention having different chambers for performing these processes, each process can be efficiently performed.

According to the third aspect of the present invention, a semiconductor substrate is cooled by being exposed to a low temperature inert gas in the cooling chamber. With this cooling process, the semiconductor substrate can be efficiently cooled without deterioration of the substrate.

According to the fourth aspect of the present invention, a low temperature inert gas is blown to the surface of a semiconductor substrate in the cooling chamber. With this cooling process, a region in which a metal film is to be formed can be more efficiently cooled as compared with the case in which the substrate is exposed to the inert gas.

According to the fifth aspect of the present invention, a semiconductor substrate is cooled by bringing the substrate in close-contact with a stage kept at a low temperature in the cooling chamber. With this cooling process, the semiconductor substrate can be efficiently cooled.

According to the sixth aspect of the present invention, the cooling process is performed in the degassing chamber or film forming chamber. Accordingly, the fabrication apparatus of the present invention can be realized with a simple structure. Also in the present invention, the cooling process is performed in a state in which a semiconductor substrate is apart from a stage already heated at a high temperature. Accordingly, the semiconductor substrate can be efficiently cooled although the cooling treatment is performed in the degassing chamber of film forming chamber.

According to the seventh aspect of the present invention, a semiconductor substrate is cooled to a suitable temperature lower than or equal to a film formation temperature. As a result, a situation advantageous for improvement of the coverage of a metal film can be realized at a high economical efficiency.

According to the eighth aspect of the present invention, a semiconductor substrate is cooled to a suitable temperature before the formation of the uppermost metal film of a stacked metal film. Accordingly, it is possible to effectively prevent formation of reaction products at the boundary between the uppermost metal film and the underlying metal film thereof, and hence to form the stacked metal film having a smooth surface. This is effective to prevent short-circuit of a pattern of metal wiring and the increased resistance of the metal wiring.

According to the ninth aspect of the present invention, a semiconductor substrate can be efficiently cooled by exposing the substrate to a low temperature inert gas before beginning of the formation of a metal film.

According to the tenth aspect of the present invention, a region in which a metal film is to be formed on a semiconductor substrate can be efficiently cooled by blowing a low temperature inert gas to the surface of the semiconductor substrate before beginning of the formation of the metal film.

According to the eleventh aspect of the present invention, a semiconductor substrate can be efficiency cooled by bringing the substrate in close-contact with a stage kept at a low temperature before the formation of a metal film.

According to the twelfth aspect of the present invention, any reaction product is not formed at the interface between the uppermost metal film of a stacked metal film and the underlying metal film thereof. Accordingly, it is possible to suppress an increase in resistance of metal wiring, to facilitate the etching process, and to effectively prevent short-circuit of a pattern of the metal wiring which would otherwise arise stemming from reaction products formed by etching.

Further, the present invention is not limited to these embodiments, but variations and modifications may be made without departing from the scope of the present invention.

The entire disclosure of Japanese Patent Application No. Hei 10-239190 filed on Aug. 25, 1998 including specification, claims, drawings and summary are incorporated herein by reference in its entirety.

What is claimed is:

1. A method for manufacturing a semiconductor device including a metal film formed in a film formation region which contains the interior of a hole formed in the semiconductor substrate, said method comprising the steps of:

forming a metal film in the film formation region by heating a semiconductor substrate to a film formation temperature; and cooling, before beginning of the formation of the metal film, the semiconductor substrate to a cold temperature being lower than the film formation temperature and in a range of −50° C. to 150° C. by exposing the semiconductor substrate to an inert gas.

2. The method for manufacturing a semiconductor device according to claim 1, wherein said step of forming the metal film comprises a step of forming an upper most metal film on an underlying metal film; and said step of cooling the semiconductor substrate comprises a step of cooling, before beginning of the formation of the uppermost metal film, the semiconductor substrate to a temperature lower than or equal to a reaction temperature at which the uppermost metal film reacts with the underlying metal film.

3. The method for manufacturing a semiconductor device according to claim 2, wherein said step of cooling the semiconductor substrate comprises blowing the inert gas onto the surface of the semiconductor substrate.

4. The method for manufacturing a semiconductor device according to claim 1, wherein said step of cooling the semiconductor substrate comprises blowing the inert gas onto the surface of the semiconductor substrate.

5. A method for manufacturing a semiconductor device including a metal film formed in a film formation region which contains the interior of a hole formed in the semiconductor substrate, said method comprising the steps of:

forming a metal film in the film formation region by heating a semiconductor substrate to a film formation temperature; and cooling, before beginning of the formation of the metal film, the semiconductor substrate to a cold temperature being lower than the film formation temperature and in a range of −50° C. to 150° C. by bringing the semiconductor substrate in close-contact with a cooled stage, wherein said stage is provided in a transfer chamber via which the semiconductor substrate is transferred from a sputtering chamber to a film forming chamber.

* * * * *